United States Patent [19]

Taketomi

[11] Patent Number: 4,812,767

[45] Date of Patent: Mar. 14, 1989

[54] OPTICAL APPARATUS USING ANOMALOUSLY STRONG MAGNETO-BIREFRINGENCE OF MAGNETIC FLUID

[76] Inventor: Susamu Taketomi, 35-8, Higashisakamoto 2-chome, Kagoshima City, Kagoshima Prefecture, Japan

[21] Appl. No.: 877,790

[22] Filed: Jun. 24, 1986

Related U.S. Application Data

[63] Continuation-in-part of Ser. No. 486,240, Apr. 18, 1983, abandoned.

[30] Foreign Application Priority Data

| Apr. 18, 1982 | [JP] | Japan | 57-64518 |
| May 1, 1982 | [JP] | Japan | 57-74100 |
| Jun. 15, 1982 | [JP] | Japan | 57-101455 |

[51] Int. Cl.$^4$ .................. G01R 33/032; G02F 1/09; G02B 5/30
[52] U.S. Cl. .................. 324/244; 324/96; 350/376; 350/406
[58] Field of Search ........... 324/96, 244, 260; 250/225; 350/374–376, 406; 356/365

[56] References Cited

U.S. PATENT DOCUMENTS

| 3,215,572 | 11/1965 | Papell | 149/2 |
| 3,353,097 | 11/1967 | Johnson | 324/244 |
| 3,791,736 | 2/1974 | Newburg | 350/406 X |
| 3,838,906 | 10/1974 | Kumada | 350/406 X |
| 4,112,367 | 9/1978 | Hepner et al. | 324/96 X |
| 4,267,509 | 5/1981 | Graham | 324/244 |

FOREIGN PATENT DOCUMENTS

| 0191978 | 11/1983 | Japan | 324/244 |

OTHER PUBLICATIONS

Suits et al, Magnetic Birefringence of Euse, Physical Review Letters, Apr. 26, 1965, vol. 14, No. 17, pp. 687–689.

Taketomi, Susamu, "Motion of Ferrite Particles-in a Magnetic Fluid Shaft Seal", Japanese Journal of Applied Physics, vol. 19, No. 10, Oct. 1980, pp. 1929–1936.

Taketomi, Susama, "Magnetic Fluid's Anomalous Pseudo–Cotton Mouton Effects–", Japanese Journal of Applied Physics, vol. 22, No. 7, Jul. 1983, pp. 1137–1143.

Taketomi, Susamu, "Magnetic Field Sensor-of a Magnetic Fluid Thin Film", Proceedings of the 3rd Sensor Symposium, 1983, pp. 175–178, Inst. of Elec. Eng. of Japan.

"Magnetooptical Effects of Magnetic Fluid", Susamu Taketomi, Journal of the Physical Society of Japan, vol. 56, No. 9, Sep. 1987, pp. 3362–3374.

"Temperature Dependence of Magneto–Optical Effect in Magnetic Fluids", S. Taketomi, Magneto–Optics, Proc. Int. Symp. Magneto–Optics, vol. 11 (1987), pp. 409–412.

"Physics of Magnetic Fluids", S. Chikazumi et al., Journal of Magnetism and Magnetic Materials, vol. 65 (1987), pp. 245–251.

*Primary Examiner*—Gerard R. Strecker
*Attorney, Agent, or Firm*—Wenderoth, Lind & Ponack

[57] ABSTRACT

An anomalously strong magneto-optical effect of a magnetic fluid thin film is obtainable when an external magnetic field is applied in the perpendicular direction to the propagation of the light beam, thus making the magnetic fluid thin film possess a birefringent property. In consequence thereof, a phase difference appears between the two modes of the light which pass through the magnetic fluid thin film. The phase difference is a single valued function of the magnetic field applied to the thin film. An apparatus using such an effect (hereinafter referred to as Magnetic Fluid Thin Film's Anomalous Pseudo-Cotton-Mouton Effect) is primarily for detecting a magnetic field and can be used as a magnetic field sensor, a transformer, an apparatus for controlling a light intensity containing an optical shutter and an optical modulator, an optically bistable apparatus, a memory for an optical computer and a light intensity stabilizer for lasers and an optical amplifier.

15 Claims, 8 Drawing Sheets

OPTICAL APPARATUS USING ANOMALOUSLY STRONG MAGNETO-BIREFRINGENCE OF MAGNETIC FLUID

BACKGROUND OF INVENTION

1. Field of Invention

This application is a continuous-in-part application of now abandoned application Ser. No. 486.240.

The present invention relates in general to a method and apparatus for detecting a magnetic field using an anomalously strong magnetic birefringence of a magnetic fluid, and more particularly to a magnetic field sensor, a transformer, an apparatus for controlling a light intensity containing an optical shutter and an optical modulator, an optically bistable apparatus, a memory means for an optical computer and a light intensity stabilizer for lasers and an optical amplifier.

2. Brief Description of Magnetic Fluids

A magnetic fluid is a colloidal suspension containing fine ferrous colloidal particles and shows a strong magneto-optical effect in a presence of a magnetic field when it is made into a thin film. This effect was recently discovered by the inventor of this invention (see S. Taketomi; Japanese Journal of Applied Physics Vol. 22 (1983) p. 1137. Therefore, before the discovery of this effect, the main application of the magnetic fluid has been limited only for rotating shaft and exclusion seals.

The magnetic fluids consist of ferro- or ferrimagnetic colloidal particles the sizes of which are less than 200Å, surfactants and solvents (see R.E. Rosensweig: International Science and Technology, July 1966, page 48). When the ferro- or ferrimagnetic substances become such fine particles, each particle becomes magnetically a single magnetic domain and it possesses the property of a permanent magnet. The magnetic force originated from the permanent magnetization makes the particles coagulate and deposit. Therefore, the ferrous colloidal solution was a very unstable solution or a very dilute one to avoid coalescence of the particles before the invention of the magnetic fluid.

The magnetic fluid was invented by Pappel in 1965 (see S. S. Papell: U.S. Pat. 3,215,572 (1965)). Since the ferrous colloidal particles 1 in the magnetic field are clad with surfactant 2, they do not coalesce with each other (see FIG. 1). This method makes it possible to produce a stable colloidal solution of the ferrous colloidal particles having a high concentration.

The magnetic fluids possess strong magnetization though they are liquid. Using this property, they have been applied to rotating shaft seals (see R. E. Rosensweig et al.: Machine Design, Mar. 28, 1968. p. 145). FIG. 2 shows the principle of the magnetic fluid shaft seals. A rotating shaft 4 and stationary pole-blocks 5 are made of magnetic substances. A permanent magnet 6 is sandwiched by the two pole-blocks 5. Therefore, a magnetic circuit 7 is made between the rotating shaft 4 and the stationary part 5. A magnetic fluid 8 is strongly attracted in the gap between the rotating shaft 4 and the stationary part 5. Consequently the magnetic fluid 8 fills the gap like a O-ring of a mechanical element and works as a shaft seal. The airtight ability of the seal is excellent in comparison with any other kinds of rotating shaft seals. Therefore, the magnetic fluid seals are successfully used as vacuum shaft seals.

Many other applications of the magnetic fluid have been proposed, for example a sink float separation apparatus, a heat engine, etc (see R. E. Rosensweig: International Science and Technology, July 1966, page 48). None of the applications of the Magnetic Fluid Thin Film's Anomalous Pseudo-Cotton-Mouton effect (i.e. "MFTFAPCM" effect), however, have been proposed.

Description of the Magnetic Fluid Thin Film's Anomalous Pseudo-Cotton-Mouton Effect The magnetic fluid is a black ink-line opaque liquid in a bulk state. This inventor discovered that when the magnetic fluid is made into a thin film having a thickness ranging from 1 $\mu$m to several tens $\mu$m with a liquid state held, visible light can pass through the magnetic fluid thin film (see S. Taketomi; Japanese Journal of Applied Physics Vol. 22 (1983) p. 1137). The inventor made a magnetic fluid thin film having a thickness of 12 $\mu$m, and carried out the following experiments.

FIG. 3 is an enlarged exploded perspective schematic view of an experimental setup of a magnetic fluid thin film's magneto-birefringence, in which the light beam 18 emitted from a light source 10 (He-Ne laser) propagates in the positive x direction. Having passed through a polarizer 20, it becomes a linearly polarized beam, whose polarization plane 20a makes an angle $\phi$ with respect to the y axis. The linearly polarized beam is composed of two linearly polarized rays. The polarization of one ray is parallel to the y axis and the other is parallel to the z axis. The two rays have the same phase.

A Helmholtz type electro-magnet 27 connected to an electrical power source 27a is vertically provided to interpose the magnetic fluid thin film element 24. A magnetic field generated by the electro-magnet 27 is applied to the magnetic fluid thin film element 24 in the y direction which is perpendicular to the light propagation. The strength of the magnetic field is variable. When the two rays pass through the magnetic fluid thin film element 24, there appears a phase difference $\theta$ between the transmitted ordinary ray and the extraordinary ray due to a magneto-birefringent property of the film. Here, the ordinary ray and the extraordinary ray are the light rays whose electric fields oscillate in respective directions which are perpendicular to and parallel to the applied field. The phase difference $\theta$ a function of the magnetic field H. Starting from $\theta=0$ at $H=0$, $\theta$ increases with H.

The polarization of an analyzer 26 makes an angle $\phi$ with respect to the y axis. The analyzer 26 transmits only the light whose polarization direction is parallel to that of the analyzer. From an optical law, the intensity I of the light 18 which passes through the analyzer 26 has the following relationship to the phase difference $\theta$ (see M. Born: Principle of Optics Pergamon Press (1964)).

$$I \alpha \cos^2(\phi - \phi') - \sin 2\phi \cdot \sin 2\phi \cdot \sin^2(\theta/2) \qquad (1)$$

If one sets $\phi$ and $\phi'$ to $\pi/4$ and $-\pi/4$, respectively, the expression (1) is simplified to $$I \alpha \sin^2(\theta/2) \qquad (2)$$

In a real experiment, one must take the absorption effect of the film into account (see S. Taketoni; Japanese Journal of Applied Physics Vol. 22 (1983) p. 1137). The expression (2) is, however, approximately valid. A method of perpendicularly arranging the polarization planes 20a and 26a of the polarizer 20 and the analyzer 26 is called the "crossed Nicol method". The inventor used this method in his experiment.

The magnetic fluid thin film element 24 was made in the following way. FIGS. 4(a) and 4(b) show a structure of the magnetic fluid thin film element 24. It consists of two transparent plane glasses 60 of 1×27×10 mm, a spacer 62 of 12micron thickness and having an opening 62 and a magnetic fluid of 1.36 gr. cm$^{-3}$ and held in the opening 63. The magnetic fluid is perfectly shut out from the air by the glasses and the spacer 62 and there is no air bubbles in the magnetic fluid film 24. The spacer 62 was made of a polyester thin film. The solvent of the magnetic fluid was diethyl-hexyl-asipate $(CH_2CH_2COOC_8H_{17})_2$ and the colloidal particles are magnetite. An opening 63 of 5 mm square was cut out from the spacer 62. Putting the spacer 63 on one of the glasses 60 and filling the opening 63 with the magnetic fluid 8, the inventor covered the other glass 60 over the spacer 63. Therefore, a 5 mm square magnetic fluid thin film element 24 of the same thickness as the spacer 62 was made. Using the magnetic fluid thin film element 24 of a 12 micron thickness, the inventor obtained the following experimental results.

FIG. 5 is the phrase difference $\theta$ vs. applied magnetic field H relationship of the magnetic fluid thin film of a 12 micron thickness. Let us compare this phase difference of the 12 micron element with that of nitrobenzene of the same thickness which is known to shown a large Cotton-Mouton effect. The $\theta$ of the nitrobenzene of 12 micron thickness at H=1040 Oe is 1.63×10$^8$ rad.. On the other hand, $\theta$ of the magnetic fluid thin film element at H=1040 Oe is 0.765 rad.. Therefore, the $\theta$ of the magnetic fluid thin film element is about 10$^7$ times larger than that of the nitrobenzene.

The word "Anomalous" in Magnetic Fluid Thin Film's Anomalous Pseudo-Cotton-Mouton effect (i.e. "MFTFAPCM" effect) originates from this anomalously strong effect. The phase difference $\theta$ is proportional to the square of the applied magnetic field H for the Cotton-Mouton effect. For "MFTFAPCM" effect, the phase difference $\theta$ increases with H, but it does not have a H$^2$ dependence. Hence comes the word "Pseudo" in "MFTFAPCM" effect.

FIG. 8 shows the graph of the intensity I of the passed beam vs. the applied magnetic field H for the magnetic fluid thin film of a 12 micron thickness. From this graph, the $\theta$-H relationship of the FIG. 5 is obtained. From FIG. 8, one finds the I is a single-valued monotonically increasing function of H.

The same kinds of experiments were carried out for two different magnetic fluid thin film elements (see S. Taketomi; Japanese Journal of Applied Physics Vol. 22 (1983) p. 1137). The density of the magnetic fluid is 1.0 gr.cm$^{-3}$ for both the elements. The thicknesses are 12 $\mu$m and 25 $\mu$m, respectively. FIGS. 6 and 7 are the $\theta$-H relationships for the elements of 12 $\mu$m and 25 $\mu$m, respectively. From FIGS. 6 and 7, it is known that the phase difference $\theta$ of 25 micron element is far less than the 25/12 times that of the 12 micron element. For usual birefringent substances, the phase difference $\theta$ is proportional to a thickness of the substance through which a light passes.

For "MFTFAPCM" effect, it is not the case. The cause of this phenomena is not made clear, but it is speculated that the boundary between the glass and the magnetic fluid contributes to the effect. From this point of view, the phase difference $\theta$ is increased if the element is made of multi-layered magnetic fluid thin films. Accordingly, the inventor claims the multi-layered magnetic fluid thin film element in this application.

The reason why the "MFTFAPCM" effect exhibits such a strong magneto-optical effect has not been made clear yet. It is, however, speculated that a strong mutual interaction among the ferrous colloidal particles plays an important role in the "MFTFAPCM" effect because of the high concentration of the ferrous colloidal particles in the magnetic fluid.

In order to compare the "MFTFAPCM" effect with the Cotton-Mouton effect and the Majorana effect, the latter two effects are explained in the following paragraphs.

Cotton-Mouton Effect

When a light is incident into a transparent substance such as nitrobenzene and at the same time a magnetic field is applied to it in the direction perpendicular to the light propagation, the substance shows a birefringent property. This is called Cotton-Mouton effect. The phase difference $\theta$ between the ordinary and extraordinary rays of the transmitted light TL is given by $$\theta = 2\pi d \cdot C \cdot H^2 \quad (3)$$

where C is Cotton-Mouton constant, d is the thickness of the transparent substance in the direction to the light propagation and H is the applied magnetic field strength. The Cotton-Mouton constant C of the nitrobenzene which is known to show the strong Cotton-Mouton effect at room temperature is 2×10$^{-12}$ cm$^{-1}$G$^{-2}$ (see Landort-Börnstein: Physikolische Chemische Tabellen). Therefore, the phase difference $\theta$ of the nitrobenzene of 12 $\mu$m thickness at H=1040 Oe is 1.63×10$^{-8}$ rad.. This value is far less than $\theta$=0.765 rad. of the magnetic fluid thin film of the same thickness with the same value of the applied magnetic field (see FIG. 5). Accordingly, the strength of the "MFTFAPCM" effect is anomalously larger than that of the Cotton-Mouton effect.

Majorana Effect

It was discovered a long time ago (early in the 20th century) that a colloidal solution containing ferrous colloidal particles shows a very weak Cotton-Mouton effect (see reference Q. Majorana: Phys. Zcitschrift 4, p. 145 (1903)). In the following, it is shown that the Majorana effect is very weak and is essentially different from the "MFTFAPCM" effect.

For a water solvent, the phase difference $\theta$ of the Majorana effect is expressed as (see Handbuch der Experimentalphysik, Bd. 16/1 chap. 7)

$$\theta/2 = \pi/180 K \cdot d \cdot (s-1) H^2 (\lambda/\lambda_{Na})^2 \quad (4)$$

where K=−9.8×10$^{-6}$, s is the specific gravity of the colloidal solution, $\lambda_{Na}$=5891 Å and $\lambda$ is the wavelength of the light used. (The notation $\beta$ and L in the expression (1) in Handbuch der Experimentalphysik, Bd. 16/1 chap. 7 correspond to $\theta/2$ and d in the expression (4) above.

Consider a ferrous colloidal solution consisting of spherical colloidal particles of ferrite (Fe$_3$O$_4$) with a diameter 200 Å and water solvent.

Accordingly, one takes the concentration of the colloidal particles as 5×10$^{12}$ particles/cm$^3$, which is the value of the upper limit of the ferrous colloidal solution to be transparent in a bulk state as pointed out by Graham (see W. Graham: U.S. Pat. No. 4,267,509). Since the mass of one colloidal particle is $2.17 \times 10^{-17}$ gr., the total mass of the colloidal particles in 1 cm³ solution is $$2.17 \times 10^{-17} \times 5 \times 10^{12} \text{ gr.cm}^{-3} = 1.09 \times 10^{-4} \text{ gr.cm}^{-3}.$$

Inserting the value $(s-1) = 1.09 \times 10^{-4}$ gr.cm$^{-3}$, $\lambda = 6328$ Å, $H = 1040$ Oe and $d = 12$ μm into the expression (4), one derives the phrase difference $\theta$ of the Majorana effect $\theta = 2.04 \times 10^{-8}$ rad. The phrase difference $\theta$ of the "MFTFAPCM" effect having the same thickness with the same field applied thereto, is 0.765 rad. Therefore, the strength of the Majorana effect is far less than that of the "MFTFAPCM" effect.

DESCRIPTION OF PRIOR ARTS

Magnetic Field Sensor

Magnetic field sensors using Hall effect, Faraday effect or magnetic resistance effect have been conventionally used in order to measure a magnetic field strength.

The magnetic field sensor using the Hall effect or the magnetic resistance effect needs an electrical current to flow in the sensor head. Measuring the current or voltage strength, one knows the magnetic field strength. The current strength, however, is likely disturbed by electrical noise and electrical insulation which is weak. It also needs a special element, thus making the magnetic field sensor expensive.

In FIG. 9, the optical magnetic field sensor using an expensive Faraday element comprises an opaque head casing 9 including a pair of prisms 9a opposedly arranged to interpose a polarizer 20, a Faraday cell 21 and an analyzer 26 between these prisms, and a pair of optical fibers 11 are parallelly inserted into a cylinder so that the optical magnetic field sensor becomes large and expensive.

A method and apparatus for optically determining the alignment of magnetic fields utilizing the Cotton-Mouton effect is described in the specification of Johnson's U.S. Pat. No. 3.353.097 (see R. Johnson: U.S. Pat. No. 3,353,097), wherein the very weak Majorana effect is used so that it is necessary to dispose a backing coil to generate a counter magnetic field. In the Johnson Specification, no magnetic fluid is used. Otherwise, a visible light could not have passed through the flask filled with the magnetic fluid. Therefore, the ferrous colloidal solution is not a magnetic fluid, but is rather the conventional dilute ferrous colloidal solution without a surfactant. In consequence, Johnson used the Majorana effect which is irrelevant to the present invention using the "MFTFAPCM" effect. Johnson makes use of the very weak Majorana effect so that it is only possible to distinguish the dark cross hair from the bright background, but it is actually impossible to detect the change of the transmitted light intensity, much less to control it.

Johnson's method of measuring the magnetic field shows that the effect used is very weak. Johnson used the method of disposing the backing coil to generate a counter magnetic field and to cancel an external magnetic field. When it is detected that the synthesized field becomes zero, one finds the external field strength through measuring the electrical current which flows in the backing coil (zeroing method). Johnson used the zeroing method on the ground that the Majorana effect is very weak. The present invention makes use of the "MFTFAPCM" effect, the strength of which is about $10^7$ times larger than that of the Majorana effect so that one can practically find the strength of the applied magnetic field through directly measuring the transmitted light intensity. It necessarily follows that the present invention is substantially different from the invention of Johnson.

A magneto-optical colloidal cell and device which takes advantage of a magnetic fluid is described in Graham's U.S. Pat. No. 4.267.509 (see W. Graham: U.S. Pat. No. 4,267,509). His invention is, however, based on the special Tyndall effect of a diluted magnetic fluid. The scattering light intensity by the diluted magnetic fluid changes with the strength of the magnetic field which is applied to the fluid. Graham made use of this effect. Accordingly, Graham's invention is irrelevant to the present invention which makes use of the "MFTFAPCM" effect.

In U.S. Pat. No. 4.112.367 (see G. Hepner: U.S. Pat. No. 4,112,367), Hepner et al discloses a magnetometer using a thin magnetic film optical waveguide with AC modulation and automatic nulling. This invention makes use of a Faraday effect of a YIG thin film. Accordingly, this invention has nothing to do with the present invention which uses "MFTFAPCM" effect.

In U.S. Pat. No. 3.791.736 (see R. Newberg: U.S. Pat. No. 3,791,736), Newberg discloses a method and apparatus utilizing the phase velocity difference of light rays for measuring a velocity of a moving object. This invention utilizes the substance such as calcite which shows a birefringent property. The phase difference of the light which passes through the substance is different in dependence upon whether the substance is at rest or it is in motion. The invention takes advantage of this phase difference and measures the velocity. Accordingly, this invention does not suggest any idea of the present invention using the "MFTFAPCM" effect.

Optical Shutter or Modulator

Kumada's U.S. Pat. No. 3.838.906 (see A. Kumada: U.S. Pat. No. 3,838,906) shows an optical switch. Kumada's invention is based on the electro-optical effect which is the effect obtainable with liquid crystals having a birefringent property when an electrical field is applied to them. Therefore, Kumada's invention does not have any description which may suggest the present invention using the "MFTFAPCM" effect.

Large Cotton-Mouton Effect

Suits et al described in Physical Review Letters, Vol. 14, No. 17 (see J. C. Suits et al.: Phys. Rev. Lett. 14, p. 668 (1965) that EuSe shows a strong Cotton-Mouton effect, but they also reported that both the Neel and the Curie temperature of EuSe are 7 k. It should be born in mind that the apparatus of the present invention is operated at room temperature. In consequence, one can not replace the magnetic fluid thin film element with a EuSe element because the latter does not show a large Cotton-Mouton effect at room temperature. The larger Cotton-Mouton effect of EuSe does not disclose the present invention, not does suggest any idea of it.

SUMMARY OF INVENTION

A primary object of this invention is to provide an optical magnetic sensor using an anomalously strong magnetic birefringence of a magnetic fluid which is far cheaper than the conventional magnetic sensor using a special crystal or liquid.

Another object of this invention is to provide a method of transforming a magnetic field strength into an electrical signal using a magnetic fluid which is entirely different from a conventional magnetic sensor using the Faraday effect.

Another object of this invention is to provide an electric magnetic transformer using a magnetic fluid by a birefringent method whereby the transformation can be carried out accurately and easily.

Another object of this invention is to provide a method of controlling a light intensity using a magnetic fluid by a birefringent method whereby the light intensity can be controlled gradually and in a stable condition.

Another object of this invention is to provide a simple apparatus for remotely sensing a magnetic field and also for remotely controlling a light intensity.

Another object of this invention is to provide a light intensity stabilizer so as to obtain a stabilized light intensity.

Another object of this invention is to provide a memory means for an optical computer.

Another object of this invention is to provide a light intensity stabilizer for a laser.

Another object of this invention is to provide a method and apparatus that is relatively inexpensive, easy to make and to operate, and can be maintained at a relatively low cost.

Still another object of this invention is to provide an optical method and apparatus using a magnetic fluid whereby a linearly polarized light beam propagates perpendicularly to the magnetic field so as to make the apparatus simple and small.

BRIEF DESCRIPTION OF THE DRAWINGS

These and other objects and disadvantages are obtained by the invention, which is described hereinbelow in connection with the accompanying drawings, wherein.

DESCRIPTION OF PREFERRED EMBODIMENT

Magnetic Field Sensor or Transformer

New types of magnetic field sensors or transformers of the magnetic field to electrical signals consist of using the "MFTFAPCM" effect and the "crossed Nicol's method".

Figure 1:
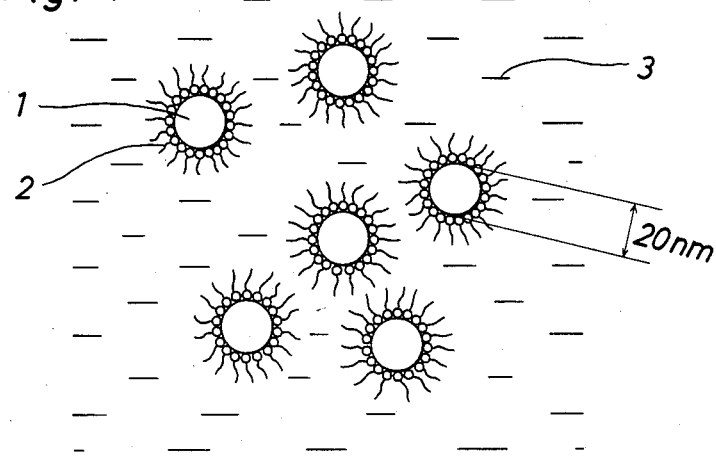
FIG. 1 is an enlarged schematic view of the structure of a magnetic fluid.
Figure 2:
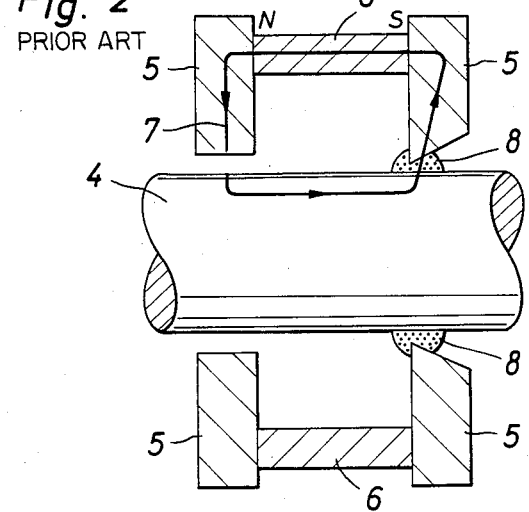
FIG. 2 is an enlarged schematic view of a magnetic fluid shaft seal.
Figure 3:
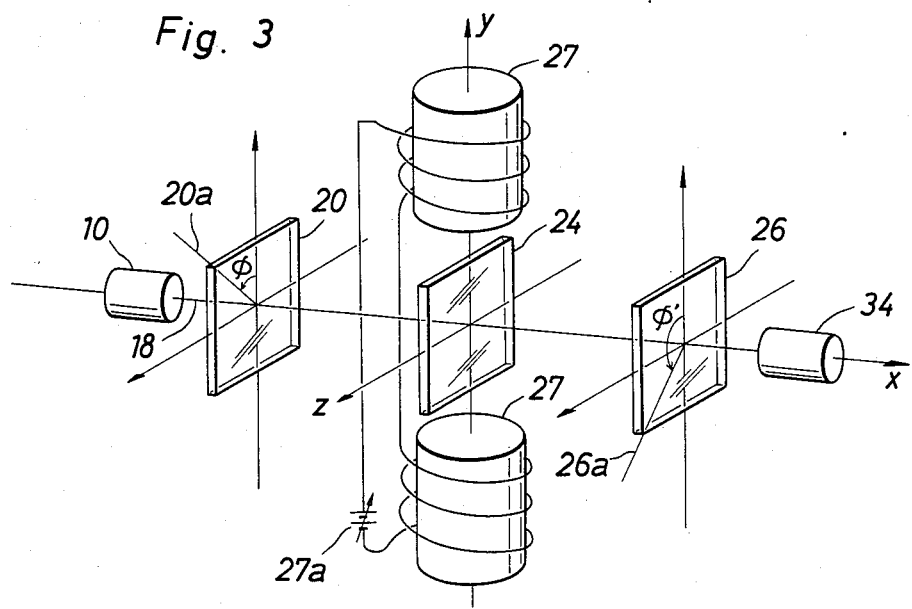
FIG. 3 is an enlarged exploded perspective schematic view of an experimental setup for the magnetic fluid thin film's magneto-birefringence.
Figure 4A:
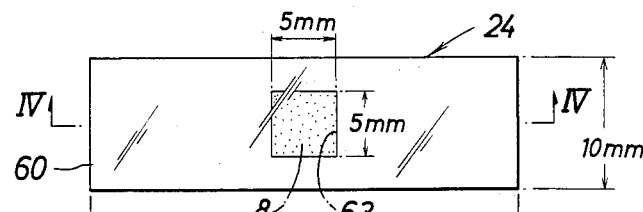
FIG. 4(a) is an enlarged front elevation of a magnetic fluid element.
Figure 4B:
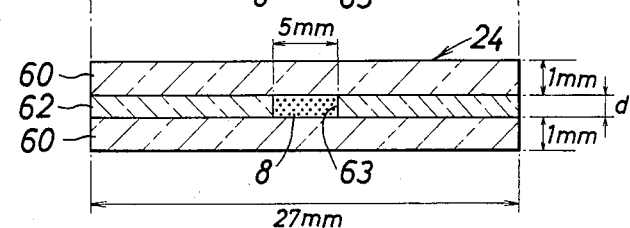
FIG. 4(b) is a vertical longitudinal sectional view taken on the line IV—IV of FIG. 4(a)
Figure 5:
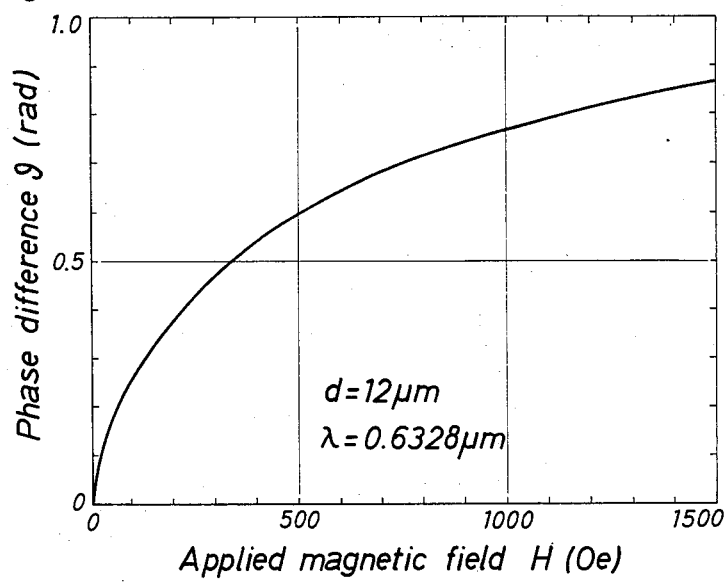
FIG. 5 is a graph showing the relationship between the applied magnetic field H and the phase difference $\theta$.
Figure 6:
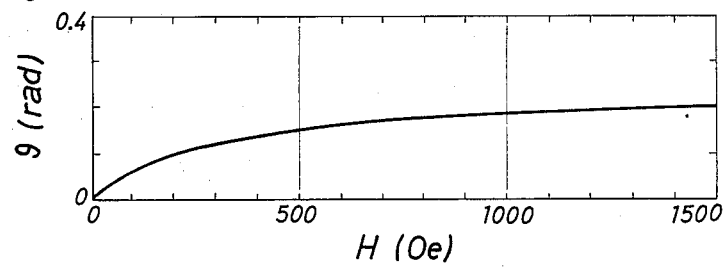
FIG. 6 is also another H-$\theta$ curve of the relationship between the applied magnetic field H and the phase difference $\theta$ between the transmitted ordinary and extraordinary light rays which is obtainable by the magnetic fluid thin film consisting of a spacer of 12 $\mu$m thickness and a pair of slide glasses of 1 mm thickness.
Figure 7:
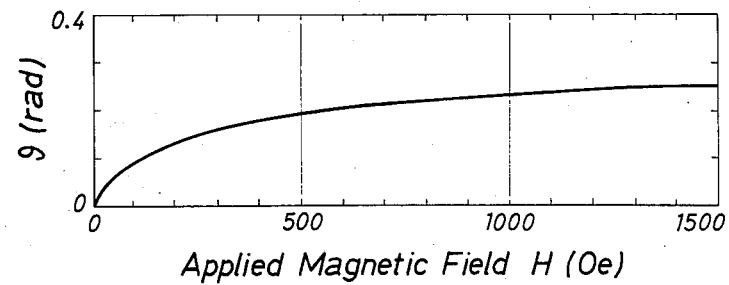
FIG. 7 is also another H-$\theta$ curve of the relationship between the applied magnetic field H and the phase difference $\theta$ between the transmitted ordinary and extraordinary lights which is obtainable by the magnetic fluid thin film consisting of a spacer of 25 $\mu$m thickness and a pair of slide glasses of 1 mm thickness.
Figure 10:
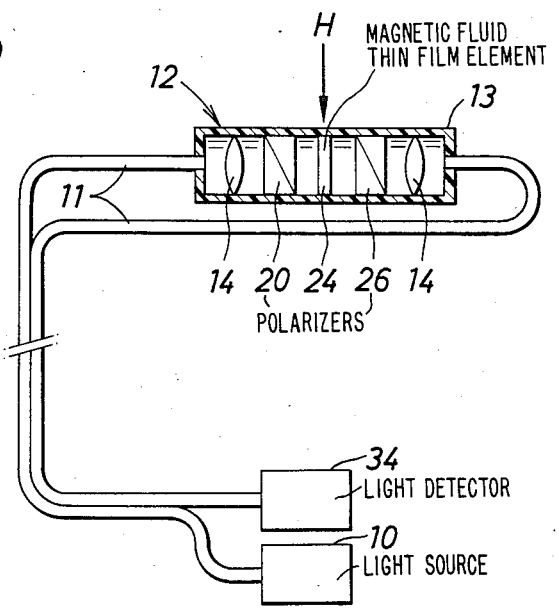
FIG. 10 is a schematic sectional view, partly cut away, of an embodiment of a magnetic field sensor of this invention.

FIG. 10 shows the essential structure of a magnetic field sensor of this invention. The fundamental structure is the same as the experimental setup of FIG. 3. A light source 10 is connected by an optical fiber 11 to a polarizing unit 12 which comprises a lens 14, a polarizer 20, a magnetic fluid thin film 24, an analyzer 26 and another lens 14 perpendicularly mounted on a light axis 18 with a calibrated distance between each other and enclosed in an opaque casing 13. Another end portion of the casing 13 is further connected by an optical fiber 11 to a light detector 34 so as to form a sensor head 12.

A light beam 18 emitted from the light source 10 is introduced into the polarizer 20 through the optical fiber 11 and the lens 14. The optical fiber 11 carries the beam 18 and the lens 14 transforms the point-like beam to a parallel light beam. The light beam 18 becomes a linearly polarized beam, and it passes through the magnetic fluid thin film element 24 and the analyzer 26 in order. The polarization of the analyzer 26 is made perpendicular to that of the polarizer 20. Another lens 14 transforms the passed beam to a point-like beam, and another optical fiber 11 carries it to a photo-detector 34, which transforms the intensity of the light beam 18 into an electrical signal intensity. The intensity I of the passed light beam is varied as is already explained in FIG. 8. The intensity I is a single valued function of the magnetic field H. Therefore, if the I-H relationship is measured beforehand, one can know the unknown magnetic field H through measuring the light intensity I with the photo-detector 34.

Figure 11:
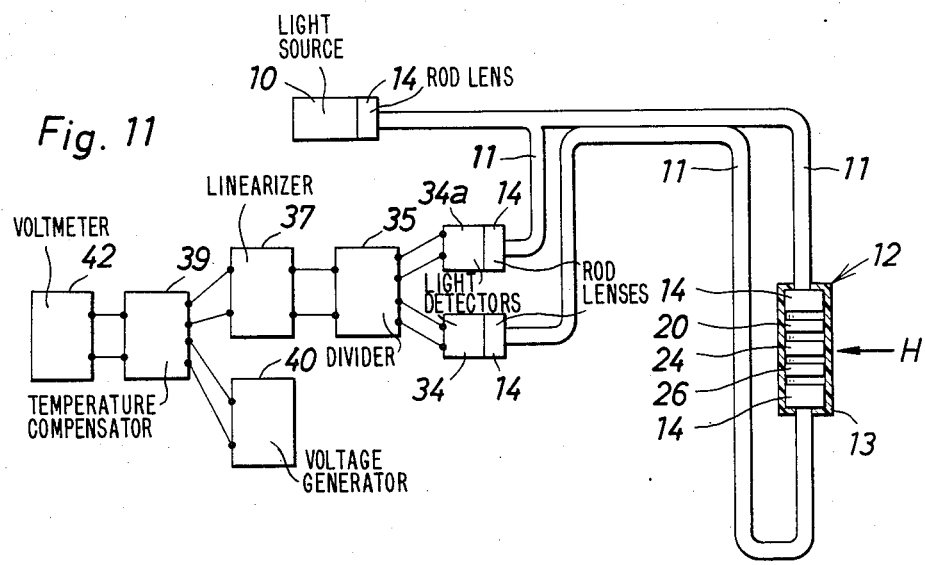
FIG. 11 is a schematic illustration of another magnetic field sensor of this invention.

FIG. 11 shows a structure of another embodiment of the magnetic field sensor, and the essential feature of the polarizing unit 12 is substantially the same as that of the magnetic field sensor shown in FIG. 10. In addition, a light source 10 having an integral rod lens 14 is connected by an optical fiber 11 to the polarizing unit 12, which in turn is connected by an optical fiber 11 to an integral rod lens 14 of a first photo-detector 34. A mid portion between the light source 10 and the polarizing unit 12 is connected by a by-pass optical fiber 11 to an integral rod lens 14 of a second photo-detector 34a which is arranged in parallel to the first photo-detector 34. These photo-detectors 34 and 34a are connected by electrical wires to a divider 35, which in turn is connected through a linearizer 37 to a temperature compensator 39. A voltage generator 40 which generates a voltage proportional to a temperature T is connected to the temperature compensator 39, which in turn is connected to a voltmeter 42.

Figure 8:
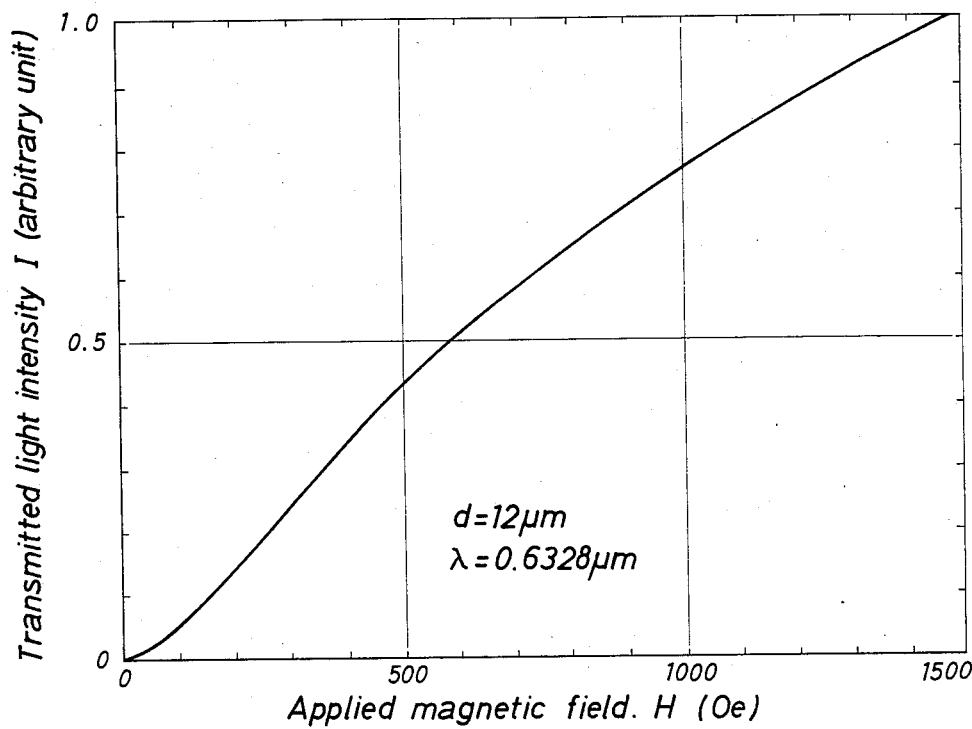
FIG. 8 is a H-I curve of the relationship between the applied magnetic field H and the transmitted light intensity I.
Figure 9:
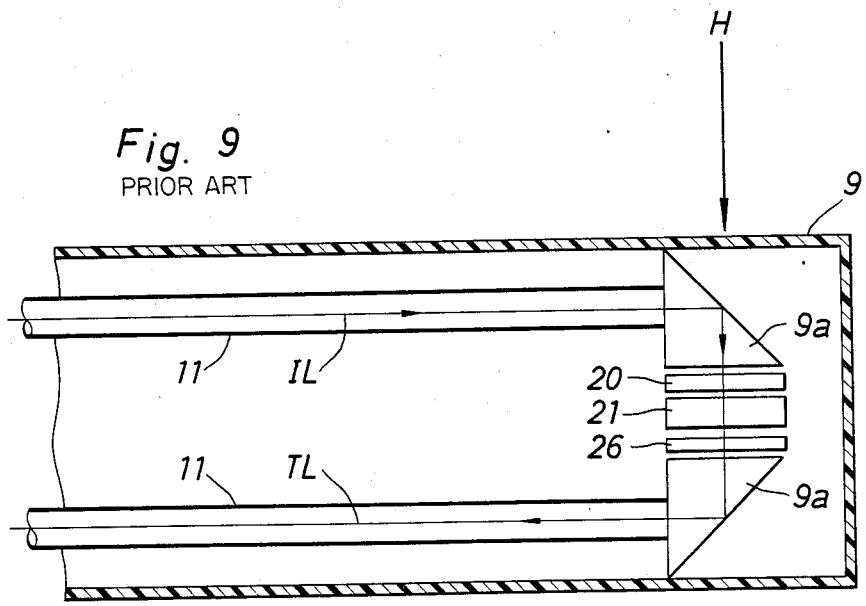
FIG. 9 is an enlarged partial sectional view of a conventional magnetic field sensor using a Faraday cell.

The intensity of the light which is emitted from the usual light source 10 fluctuates with time. To compensate for this fluctuation, the second photo-detector 34a monitors the intensity $I_0$ of the light which is emitted from the light source 10. The divider 35 computes the ratio of I to $I_0$. As shown in FIG. 8, the I-H relationship is desirable for measuring the magnetic field. The linearizer 37 transforms the nonlinear I-H relationship into a linear relationship. A personal computer may be used as the linearizer 37. The output of the linearizer 37 still has a dependence on temperature.

The temperature compensator 39 multiplies the output signal by a signal proportional to T which is generated by the voltage generator 40. Thus, the final output signal $I_4$ of the temperature compensator 39 has the form $$I_4 = \text{const} \cdot H$$

which has no dependence on T and is free from the incident light fluctuations.

Optical Shutter or Optical Modulator

In FIG. 8, the intensity of the passed light is varied with the applied magnetic field H. Using the same equipment and by controlling the applied magnetic field H, one can control the intensity of a passing light.

Figure 12:
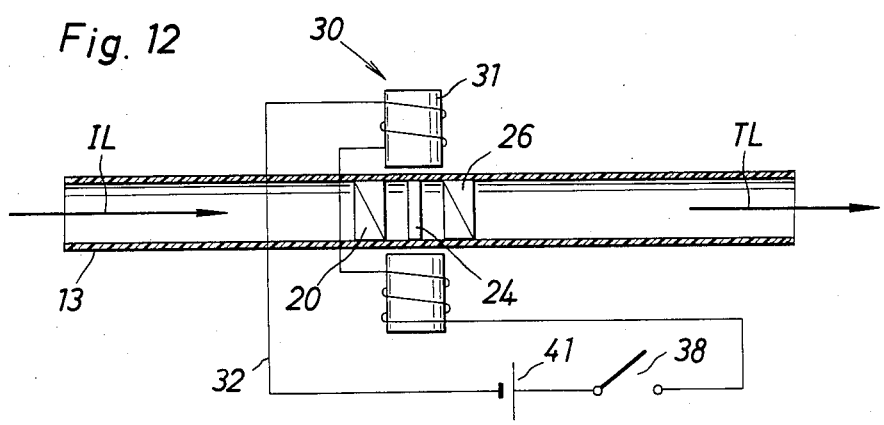
FIG. 12 is a schematic illustration of an embodiment of an optical shutter of this invention.

In FIG. 12, an optical shutter comprises a polarizer 20, a magnetic fluid thin film element 24 and an analyzer 26 arranged perpendicularly on a path of the light beam 18 and enclosed in an opaque casing 13. A magnetic field producer 30 is provided at the magnetic fluid thin film element 24. The magnetic field producer 30 comprises a pair of electro-magnets 31 arranged to interpose the magnetic fluid element vertically, a wire 32 wound around the electro-magnets 31, a change-over switch 38 and a DC power source 41. An incident light IL passes through the polarizer 20, the magnetic fluid thin film element 24, and the analyzer 26 in order. The polarization of the analyzer 26 is perpendicular to that of the polarizer 20. The electro-magnets 31 can apply a magnetic field to the magnetic fluid thin film element 24, but there is no magnetic field with no current flowing through the electro-magnets 31. Therefore, no light passes through the analyzer 26 as shown in FIG. 8. When the switch 38 is turned on so as to cause an electrical current to flow in the magnets 31, a magnetic field occurs and light passes through the analyzer 26. Consequently, this system works as an optical shutter.

Figure 13:
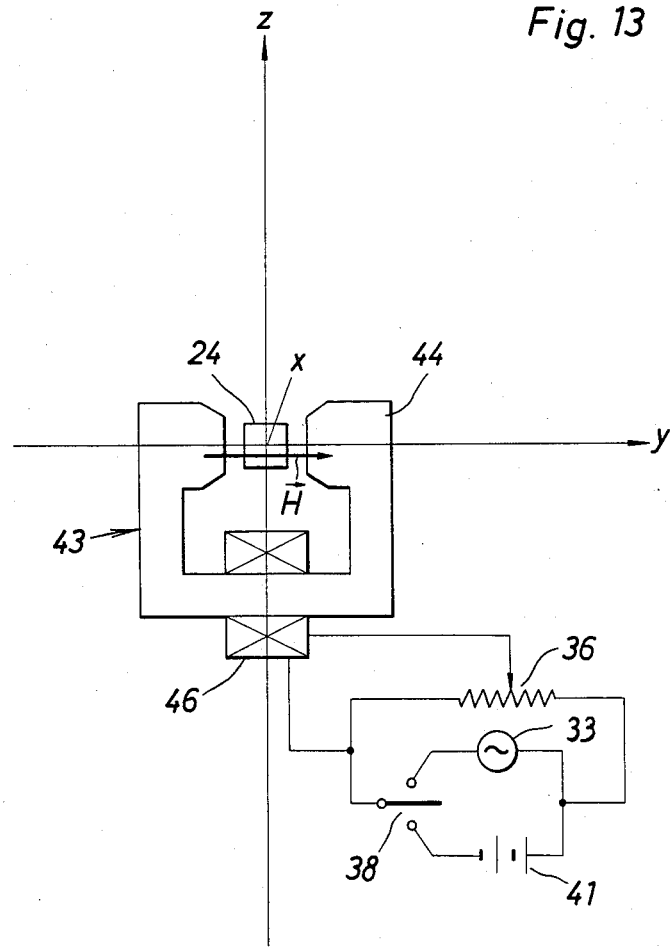
FIG. 13 is a schematic illustration of an embodiment of a means for applying a magnetic field to a magnetic fluid.

FIG. 13 is a schematic illustration of an embodiment of a magnetic field generator for applying a magnetic field to a magnetic fluid. A magnetic circuit 43 consists of a ferromagnetic yoke 44 and a coil 46. The magnetic field strength H can be changed by controlling an electrical current flowing in the coil 46 through a variable resistor 36 of an AC power source 33, and the DC power source 41.

Figure 14:
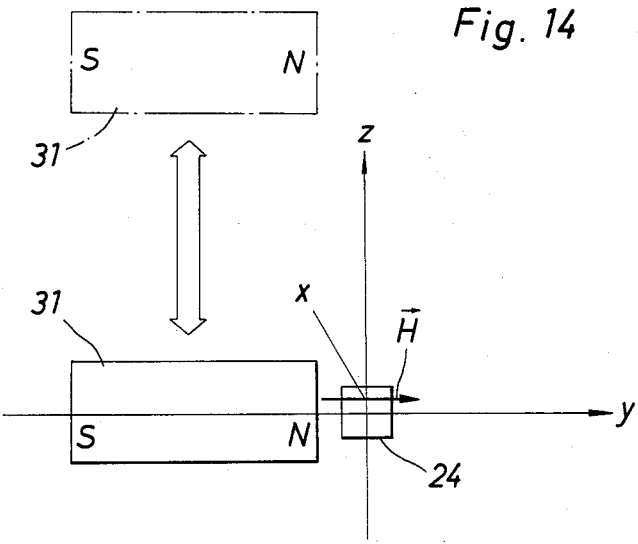
FIG. 14 is a schematic illustration of another embodiment of a magnetic field generator.

In FIG. 14, another example of the magnetic field generator is shown, wherein a permanent magnet or electro-magnet 31 is either brought close to or kept apart from the magnetic fluid thin film element 24 in order to change the magnetic field strength applied to the magnetic fluid.

Figure 15:
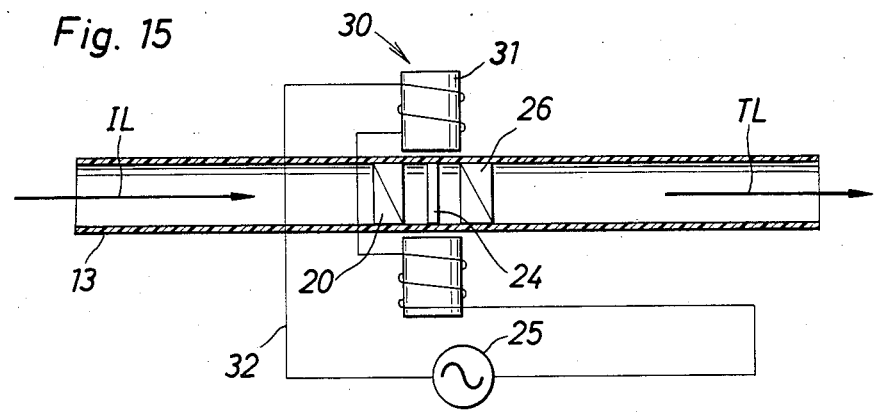
FIG. 15 is a schematic illustration of an embodiment of an optical modulator.

FIG. 15 shows the structure of an optical modulator which comprises a polarizer 20, a magnetic fluid thin film element 24 and an analyzer 26 arranged perpendicularly on a path of the light beam 18 and enclosed in an opaque casing 13. Provide also at the magnetic fluid thin film element 24 is a magnetic field producer 30 which comprises a pair of electro-magnets 31 arranged to interpose vertically the magnetic fluid thin film element 24, an electrical wire 32 wound around the electro-magnets 31, and a modulated current source 25. A modulated electrical current flows in the electro-magnets 31 from the current modulator 25. The magnetic field strength is modulated in proportion to the electrical current. Accordingly, the intensity of the passed light TL is also modulated in accordance with the modulated electrical current.

Light Stabilizer, Optical Memory and Optical Amplifier

Optically Bistable Device Using "MFTFAPCM" Effect

Certain kinds of substances show strange optical phenomena. They are opaque so long as the incident light intensity does not exceed a certain threshold. They, however, become transparent when the intensity exceeds the value. Conversely, they change suddenly from transparent to opaque with a decrease of the incident light intensity.

Figure 16:
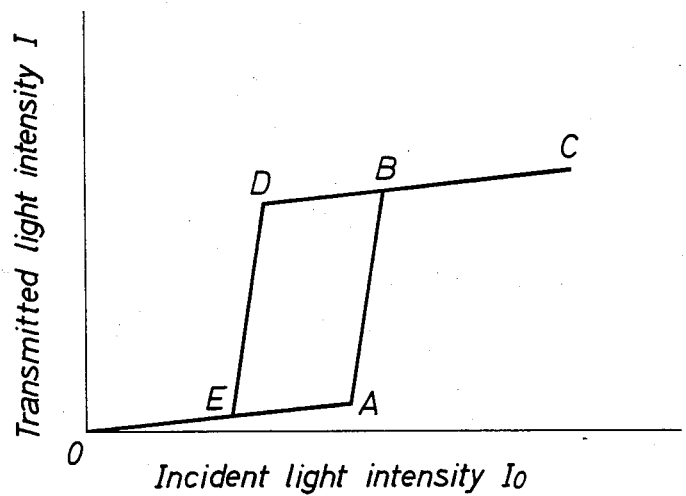
FIG. 16 is a graph of optical bistability showing the relationship between the incident light intensity $I_0$ and the transmitted light intensity I.

FIG. 16 shows an optically bistable characteristic obtainable by the means for applying a magnetic field to a magnetic fluid, and especially the relationship between the incident light intensity $I_0$ and the transmitted light intensity I for those substances. With an increase of the incident light intensity $I_0$, the substance changes from opaque to transparent and the graph jumps up from A to B. With a decrease of $I_0$, the graph jumps down from D to E. The transmitted light intensity I is almost unchanged even with the change of $I_0$ in the region OEA and DBC, respectively, in FIG. 16.

The optically bistable device can be made using the "MFTFAPCM" effect and the "crossed Nicol's method". The structure of the optically bistable device shown in FIG. 17 is substantially the same as those shown in FIGS. 12 and 13 so far as the light passes through the analyzer 26.

Figure 17:
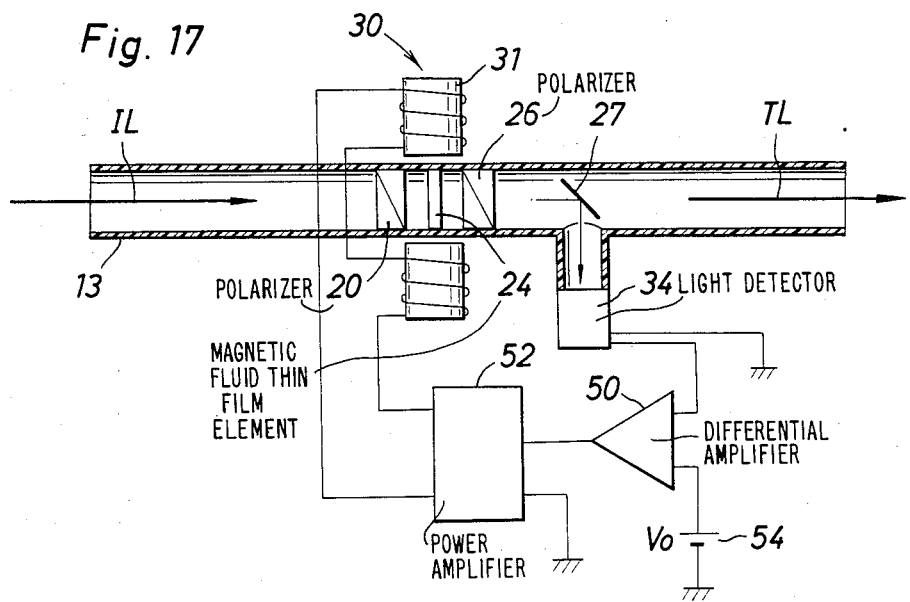
FIG. 17 is a schematic illustration of an embodiment of an apparatus for generating optical bistability.

In FIG. 17, an embodiment of an apparatus for generating the optical bistability is shown. The apparatus comprises, in addition to the elements shown in the foregoing embodiments, a beam splitter 27, a photo-detector 34, a differential amplifier 50, an electrical power amplifier 52 and a variable electrical voltage source 54. A part of the transmitted light TL is introduced into the photo-detector 34 through the beam splitter 27. The photo-detector 34 generates an electrical voltage proportional to the transmitted light intensity. The difference between this voltage V and a bias voltage $V_0$ is amplified by the differential amplifier 50 and the electrical power amplifier 52, successively. The electrical power amplifier 52 supplies an electrical current to the electro-magnet 31. When the incident light intensity $I_0$ is small, there is almost no transmitted light TL, consequently flowing no electric current. With an increase of $I_0$, a small amount of the transmitted light TL begins to leak which is detected by the photo-detector 34. The output of the differential amplifier 59, however, is zero so long as the value $V-V_0$ is minus.

With still more of an increase of $I_0$, the voltage V which is generated by the photo-detector 34 exceeds the bias voltage $V_0$ and a electrical current begins to flow in the electro-magnet 31. It generates a magnetic field, and it makes the magnetic fluid thin film element 24 possess a birefringent property. It makes much more light pass through the system. The photo-detector 34 detects the increase of the transmitted light intensity and more electrical current flows. The stronger the current, the larger the magnetic field. Thus, the magnetic fluid thin film element 24 possesses a much stronger birefringent property which makes the transmitted light intensity much stronger. This feedback process occurs in an instant, which corresponds to the transition from A to B in FIG. 16.

Still more of an increase in $I_0$ does not make an increase in I any more. Since the phase difference $\theta$ already reaches $\pi$, the further increase in $I_0$ makes $\theta$ exceed the value of $\pi$. The excess of $\theta$ over $\pi$ decreases I from expression (2). Therefore, I does not increase any more with still more of an increase in $I_0$. This is the reason why I is almost constant in the region of DBC in FIG. 16.

The cause of the hysteresis appearance is as follows. The apparatus for generating the optical bistability shown in FIG. 17 determines the relationship between the transmitted light intensity I and the phase difference $\theta$ as $$\theta = kI + \theta_0 \quad (5)$$

where k and $\theta_0$ are positive constants. Here the ratio of I to the incident light intensity $I_0$ is defined as $$\tau = I/I_0 \quad (6)$$

and then, the expression (5) is transformed into $$\tau = (1/kI_0)(\theta - \theta_0) \quad (7)$$

On the other hand, from the expression (2), it leads to $$\tau = \sin^2(\theta/2) \quad (8)$$

Figure 18:
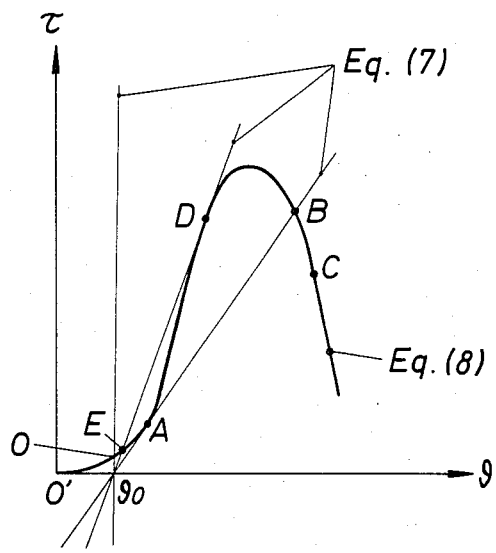
FIG. 18 is graph showing the $\tau$-$\theta$ relationship.

The expressions (7) and (8) are shown schematically in FIG. 18 where $\theta$ is scaled in the ordinate and $\tau$ in the abscissa. The gradient of the straight line in the expression is proportional to the inverse of $I_0$. The state of no incident light corresponds to the straight line parallel to $\tau$ axis. The realized $\theta$ and $\tau$ values correspond to the crossed point of the two graphs in the expressions (7) and (8). At $I_0=0$, the crossed point is approximately 0 in FIG. 18. It moves from 0 to A with an increase of $I_0$.

There are two crossed points A and B at a certain value of $I_0$. With still more increase in $I_0$, the crossed point jumps from A to B and moves along BC. With a decrease of $I_0$, it moves from C to D through B. With still more decrease in $I_0$, it jumps down from D to E and goes along EO. The OABCDE in FIG. 18 correspond to those in FIG. 16, respectively. This is the cause of the hysteresis appearance.

Light Stabilizer

As has already been mentioned, the transmitted light intensity I is almost unchanged with the change of $I_0$ in the region DBC in FIG. 16. Taking advantage of this property, a stabilizer of light intensity of a light source can be made using the apparatus shown in FIG. 17. For example, a light intensity emitted from a laser fluctuates with time. If we take the laser's light incident into the equipment of FIG. 17, the transmitted light intensity I is constant as is shown in the DBC region of FIG. 16. In conclusion, if we adopt the apparatus of FIG. 17, we can use it as a light stabilizer.

Memory of Optical Computer

The transmitted light intensity I is almost unchanged with the change of $I_0$ in the region OEA and DBC, respectively, in FIG. 16. Taking advantage of this property, memory devices of an optical computer can be made. For example, one can assign a one (or zero) signal to the region OEA and a zero (or one)signal to the region DBC, respectively, in FIG. 16. Thus, a binary memory is established using the apparatus of FIG. 17.

Optical Amplifier

Figure 19:
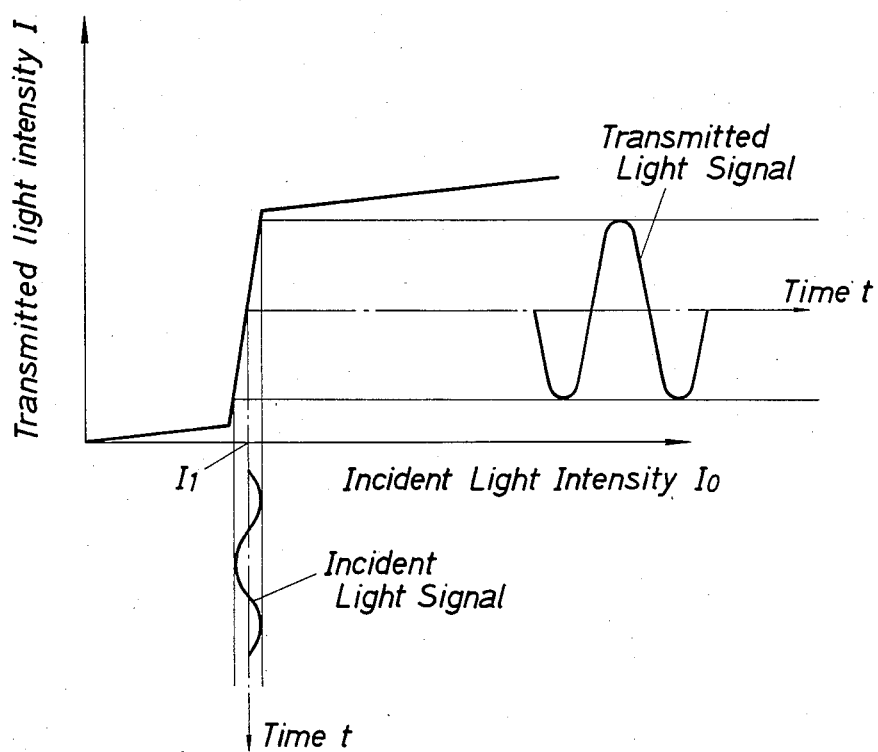
FIG. 19 is a graph of an optical amplifier showing the relationship between the incident light intensity $I_0$ and the transmitted light intensity I.

If the electrical bias voltage $V_0$ in FIG. 17 is adequately chosen, the hysteresis in FIG. 16 vanishes. In this case, the relationship between the incident light intensity $I_0$ and the transmitted light intensity I is shown in FIG. 19. Using this relationship, the incident signal can be amplified. For example, when the light whose intensity oscillates around $I_1$ with time is incident in the system of FIG. 17, the transmitted light intensity oscillation is amplified (see FIG. 19).

Multi-layered Magnetic Fluid Thin Film's Structure

As already described previously, it is preferable to use a multi-layered magnetic fluid thin film for obtaining strong "MFTFAPCM" effect.

Figure 20:
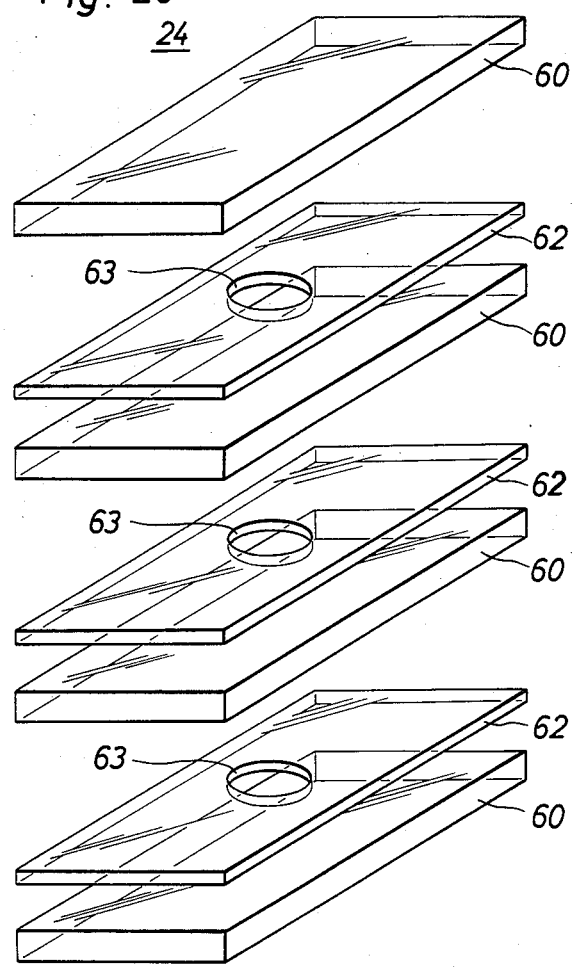
FIG. 20 is an enlarged exploded perspective view of a multi-layered magneitic fluid element.
Figure 21:
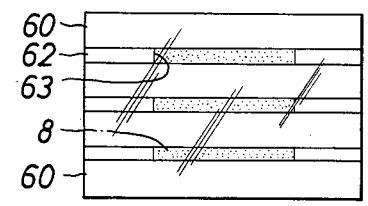
FIG. 21 is an enlarged side elevation of a multi-layered magnetic fluid element.

In FIGS. 20 and 21, a spacer 61 of a polymer thin film having a calibrated central opening 62 for storing a magnetic fluid 8 is sandwiched between the two transparent plates such as glass plates 60. Preferably, two or more spacers 61 are sandwiched between three or more transparent plates 60 to form a single or multi-layered magnetic fluid thin film element 24.

Figure 22:
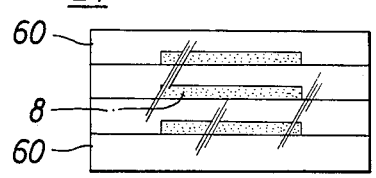
FIG. 22 is an enlarged side elevation of another embodiment of the multi-layered magnetic fluid element.
Figure 23:
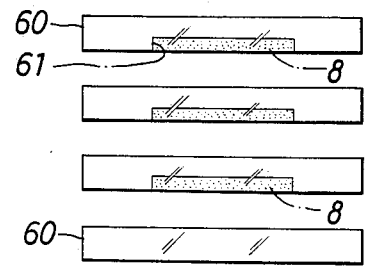
FIG. 23 is an enlarged side elevation of the multi-layered magnetic fluid element, with each plate being separated for explanation.

In FIGS. 22 and 23, three or more transparent plates each having a calibrated central cavity at each side for storing a magnetic fluid 8 and one transparent plate 60 having no cavity are laid on top of one another to form a multi-layered magnetic fluid thin film element 24.

When the multi-layered magnetic fluid thin film element 24 having a plurality of incident planes and emitting planes is located in the place where the magnetic fluid thin film element 24 should exist in FIGS. 10, 11, 12, 15 and 17, an excellently strong "MFTFAPCM" effect can be obtained.

OTHER ADVANTAGES OF THE INVENTION OVER PRIOR ARTS

The strength of the "MFTFAPCM" effect is extraordinarily stronger than those of the Cotton-Mouton effect of usual substances and Majorana effect, the details of which have already been disclosed. One can apply this strong effect to the devices which make use of the Cotton-Mouton effect or Majorana effect. By replacing the usual elements which show the Cotton-Mouton effect or the Majorana effect with the magnetic fluid thin film element in those devices, one can make the devices themselves work more efficiently and powerfully.

The advantage of this invention is not limited to this effect. The thickness of the magnetic fluid thin film is of a micron order so that it enables one to make the magnetic fluid thin film element into a very small element of a micron order. Accordingly, it can be provided on or in a silicon wafer which is used in the field of microelectronics.

The magnetic fluid thin film element can be made at low cost. For example, it needs only $10^{-4}$ cm$^3$ of the magnetic fluid to make a magnetic fluid thin film of 1 cm square having a thickness of 1 $\mu$m. The present cost of the magnetic fluid is 1/cm$^3$, so it costs only $10$^{-4}$ for the film. The cost of the magnetic fluid thin film is cheaper than that of a Faraday cell which is also used as a magneto-optical device.

In addition, it is easy to produce the magnetic fluid thin film. It needs a large scale vapor deposition apparatus to make a solid thin film. On the other hand, the magnetic fluid thin film processing is very easy.

Since optical fibers are used in the magnetic field sensor instead of current leads, this type of the sensor is free from electrical noise and the electrical insulation is complete.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. An apparatus for controlling a light intensity of a light beam which comprises:
    a light source;
    a first optical fiber connected to said light source;
    a polarizing unit connected to said first optical fiber and including a first lens, a polarizer, a magnetic fluid thin film element containing a fluid consisting of fine ferromagnetic particles having a particle density of more than $10^{15}$ particles/cc in a colloidal solution, an analyzer and a second lens;
    a second optical fiber connected to said polarizing unit and a photo-detector; eachof the above recited elements being mounted so as to be aligned sequentially adjacent to each other in a row on a light axis; and
    a magnetic field producer arranged near said magnetic fluid thin film element for applying an adjustable magnetic field to said magnetic fluid thin film element in a direction which is perpendicular to the light axis;
    wherein said field producer renders said magnetic fluid thin film element birefringent and said light intensity is controlled by the light beam through said analyzer after passing through said magnetic fluid thin film element.

2. An apparatus as recited in claim 1, wherein said magnetic fluid thin film element comprises two transparent plane plates of 1×27×10 mm, a transparent spacer of 12 micron thickness and having an opening and a magnetic fluid of 1.35 gr.cm arightly held in the opening, said magnetic fluid having a thickness of less than 50 $\mu$m.

3. An apparatus as recited in claim 1, wherein said magnetic fluid thin film element comprises a plurality of transparent plates and spacers of a solid thin film, each of said spacers being sandwiched between said transparent plates, each spacer having a calibrated central opening for storing said magnetic fluid having a thickness of less than 50 $\mu$m.

4. An apparaus for controlling a light intensity as claimed in claim 1, further comprising:
    a beam splitter mounted within said apparatus so as to be aligned on the light axis;
    wherein said magnetic field strenght producer applies said adjustable magnetic field in a direction for detecting a part of the output light delivered from said beam splitter, and further comprising a differential amplifier and an electrical amplifier.

5. An apparatus as recited in claim 4, wherein said magnetic fluid thin film element comprises two transparent plane plates of 1×27×10 mm, a transparent spacer of 12 micron thickness and having an opening and a magnetic fluid of 1.35 gr.cm arightly held in the opening, said magnetic fluid having a thickness of less than 50 $\mu$m.

6. An apparatus as recited in claim 4, wherein said magnetic fluid thin film element comprises a plurality of transparent plates and spacers of a solid thin film, each of said spacers being sandwiched between said transparent plates, each spacer having a calibrated central opening for storing said magnetic fluid having a thickness of less than 50 $\mu$m.

7. An apparatus for transforming a magnetic field stregth into an electrical signal which comprises:
    a light source and a first optical fiber connected to said light source;
    a polarizing unit connected to said first optical fiber and including a first lens, a polarizer, a magnetic fluid thin film element containing a fluid consisting of fine ferromagnetic particles having a particle density of more than $10^{15}$ particles/cc in a colloidal solution, an analyzer and a second lens;
    a second optical fiber connected to said polarizing unit;
    each of the above-recited elements being mounted so as to be aligned sequentially adjace to each other in a row on a light axis;
    a second optical fiber connected to said second lens;
    a first photo-detector which is integral with another rod lens and connected to another end of said second optical fiber;
    a second photo-detector which is integral with another rod lens and arranged in parallel to said first photo-detector and connected by a by-pass optical fiber to a mid portion between said light source and said polarizing unit;
    a divider respectively electrically connected to said first and second photo-detectors;
    a linearizer electrically connected to said divider;
    a temperature compensator electrically connected to said linearizer;

a voltage generator electrically connected to said temperature compensator in parallel to said linearizer;

a voltmeter electrically connected to said temperature compensator;

a magnetic field producer which is disposed in a direction perpendicular to said light beam propagation for applying a magnetic field to said magnetic fluid thin film element in a direction to said axis so as to make said magnetic fluid birefringent;

and a means for detecting said magnetic field strength.

8. An apparatus as recited in claim 7, wherein said magnetic fluid thin film element comprises two transparent plane plates of $1 \times 27 \times 10$ mm, a transparent spacer of 12 micron thickness and having an opening and a magnetic fluid of 1.35 gr.cm arightly held in the opening, said magnetic fluid having a thickness of less than 50 $\mu$m.

9. An apparatus as recited in claim 7, wherein said magnetic fluid thin film element comprises a plurality of transparent plates and spacers of a solid thin film, each of said spacers being sandwiched between said transparent plates, each spacer having a calibrated central opening for storing said magnetic fluid having a thickness of less than 50 $\mu$m.

10. An apparatus as claimed in claim 7, wherein said magnetic fluid thin film element comprises a plurality of transparent plates and spacers of a solid thin film, each of said spacers being sandwiched between said transparent plates, each spacer having a calibrated central opening for storing magnetic fluid.

11. An apparatus as recited in claim 10, wherein said magnetic fluid thin film element comprises two transparent plane plates of $1 \times 27 \times 10$ mm, a transparent spacer of 12 micron thickness and having an opening and a magnetic fluid of 1.35 gr.cm arightly held in the opening, said magnetic fluid having a thickness of less than 50 $\mu$m.

12. An apparatus as recited in claim 10, wherein said magnetic fluid thin film element comprises a plurality of transparent plates and spacers of a solid thin film, each of said spacers being sandwiched between said transparent plates, each spacer having a calibrated central opening for storing said magnetic fluid having a thickness of less than 50 $\mu$m.

13. An apparatus as claimed in claim 7, wherein said magnetic fluid thin film element comprises a plurality of transparent plates each having a calibrated central cavity at each side for storing said magnetic fluid and one transparent plate having no cavity laid adjacent thereto.

14. An apparatus as recited in claim 13, wherein said magnetic fluid thin film element comprises two transparent plane plates of $1 \times 27 \times 10$ mm, a transparent spacer of 12 micron thickness and having an opening and a magnetic fluid of 1.35 gr.cm arightly held in the opening, said magnetic fluid having a thickness of less than 50 $\mu$m.

15. An apparatus as recited in claim 13, wherein said magnetic fluid thin film element comprises a plurality of transparent plates and spacers of a solid thin film, each of said spacers being sandwiched between said transparent plates, each spacer having a calibrated central opeing for storing said magnetic fluid having a thickness of less than 50 $\mu$m.

* * * * *

UNITED STATES PATENT AND TRADEMARK OFFICE
CERTIFICATE OF CORRECTION

PATENT NO. : 4,812,767

DATED : March 14, 1989

INVENTOR(S) : Susamu Taketomi

It is certified that error appears in the above-identified patent and that said Letters Patent is hereby corrected as shown below:

Cover Page, first column, last line: change "Particles-in" to --Particles in--;

second column, line 3: change "Susama" to --Susamu--;
    line 13: after "Taketomi" insert --et al.--;
    line 15: after "Taketomi" insert --et al.--.

In the Drawings, Figs. 5-7 and 18 (both occurrences): change "$\vartheta$" to --$\theta$--.

Column 1, line 8: change "continuous-in-part" to --continuation-in-part--;

Column 2, line 42: before "a" insert --is--;
  line 45: change "$\phi$" to --$\emptyset$--;
  line 54: change "$2\phi$" (second occurrence) to --$2\emptyset$--;

Column 3, line 28: change "$10^8$" to --$10^{-8}$--;

Column 6, line 52: change "7 k" to --7 K--;

Column 11, line 54: change "(1/k" to --(1/k)--;

Column 13, line 26: change "$1/cm^3$" to --$\$1/cm^3$--;

Column 14, line 7: change "gr.cm" to --$gr.cm^{-3}$--;
  line 30: change "gr.cm" to --$gr.cm^{-3}$--;

UNITED STATES PATENT AND TRADEMARK OFFICE
CERTIFICATE OF CORRECTION

PATENT NO. : 4,812,767

DATED : March 14, 1989

INVENTOR(S) : Susamu Taketomi

Page 2 of 2

It is certified that error appears in the above-identified patent and that said Letters Patent is hereby corrected as shown below:

Column 15, line 18: change "gr.cm" to --$gr.cm^{-3}$--;

Column 16, line 5: change "gr.cm" to --$gr.cm^{-3}$--;

line 24: change "gr.cm" to --$gr.cm^{-3}$--.

Signed and Sealed this

Ninth Day of October, 1990

*Attest:*

HARRY F. MANBECK, JR.

*Attesting Officer*     *Commissioner of Patents and Trademarks*

UNITED STATES PATENT AND TRADEMARK OFFICE
CERTIFICATE OF CORRECTION

PATENT NO. : 4,812,767
DATED : March 14, 1989
INVENTOR(S) : Susamu Taketomi

It is certified that error appears in the above-identified patent and that said Letters Patent is hereby corrected as shown below:

Column 2, line 45: change "$\phi$" to --$\phi'$--;

line 54: change "$2\phi$" (second occurrence) to --$2\phi'$--.

Signed and Sealed this

Sixth Day of August, 1991

Attest:

HARRY F. MANBECK, JR.

Attesting Officer

Commissioner of Patents and Trademarks